United States Patent [19]

Akimoto et al.

[11] Patent Number: 5,405,443
[45] Date of Patent: Apr. 11, 1995

[54] SUBSTRATES PROCESSING DEVICE

[75] Inventors: Masami Akimoto; Kazuyuki Gotou, both of Kumamoto; Yasushi Ito, Kawasaki, all of Japan; Katsuya Okumura, Poughkeepsie, N.Y.

[73] Assignees: Tokyo Electron Limited, Tokyo; Tokyo Electron Kyushu Limited, Kumamoto; Kabushiki Kaisha Toshiba, Kawasaki, all of Japan

[21] Appl. No.: 51,554

[22] Filed: Apr. 23, 1993

[30] Foreign Application Priority Data

Apr. 24, 1992 [JP] Japan ................... 1-129925

[51] Int. Cl.⁶ .................................. B05C 5/00
[52] U.S. Cl. ...................... 118/668; 118/52; 118/693; 118/694; 118/712; 222/64
[58] Field of Search ............... 118/668, 693, 694, 712, 118/320, 52; 141/67; 222/64, 152

[56] References Cited

U.S. PATENT DOCUMENTS

| | | | |
|---|---|---|---|
| 2,817,600 | 12/1957 | Yahnke | 118/712 |
| 3,605,682 | 9/1971 | Groce et al. | 118/694 |
| 4,840,138 | 6/1989 | Stirbis | 118/694 |
| 5,090,594 | 2/1992 | Randall, Jr. et al. | 222/64 |
| 5,127,362 | 7/1992 | Iwatsu et al. | 118/667 |

FOREIGN PATENT DOCUMENTS

| | | | |
|---|---|---|---|
| 57-78972 | 5/1982 | Japan . | |
| 0010511 | 1/1985 | Japan | 118/712 |
| 1363145 | 12/1987 | U.S.S.R. | 118/668 |

*Primary Examiner*—W. Gary Jones
*Assistant Examiner*—Laura E. Edwards
*Attorney, Agent, or Firm*—Oblon, Spivak, McClelland, Maier & Neustadt

[57] ABSTRACT

A substrates processing device having a tank in which process solution is contained, a bottle communicated with the tank through a conduit and located above an object to be processed with the process solution supplied, a nozzle located under the bottle, a support for supporting the object to be processed, and a changeover device for making pressure in it negative through a conduit when the process solution is to be added to it and also making pressure in it normal through the conduit when the process solution is to be supplied to the nozzle.

17 Claims, 6 Drawing Sheets

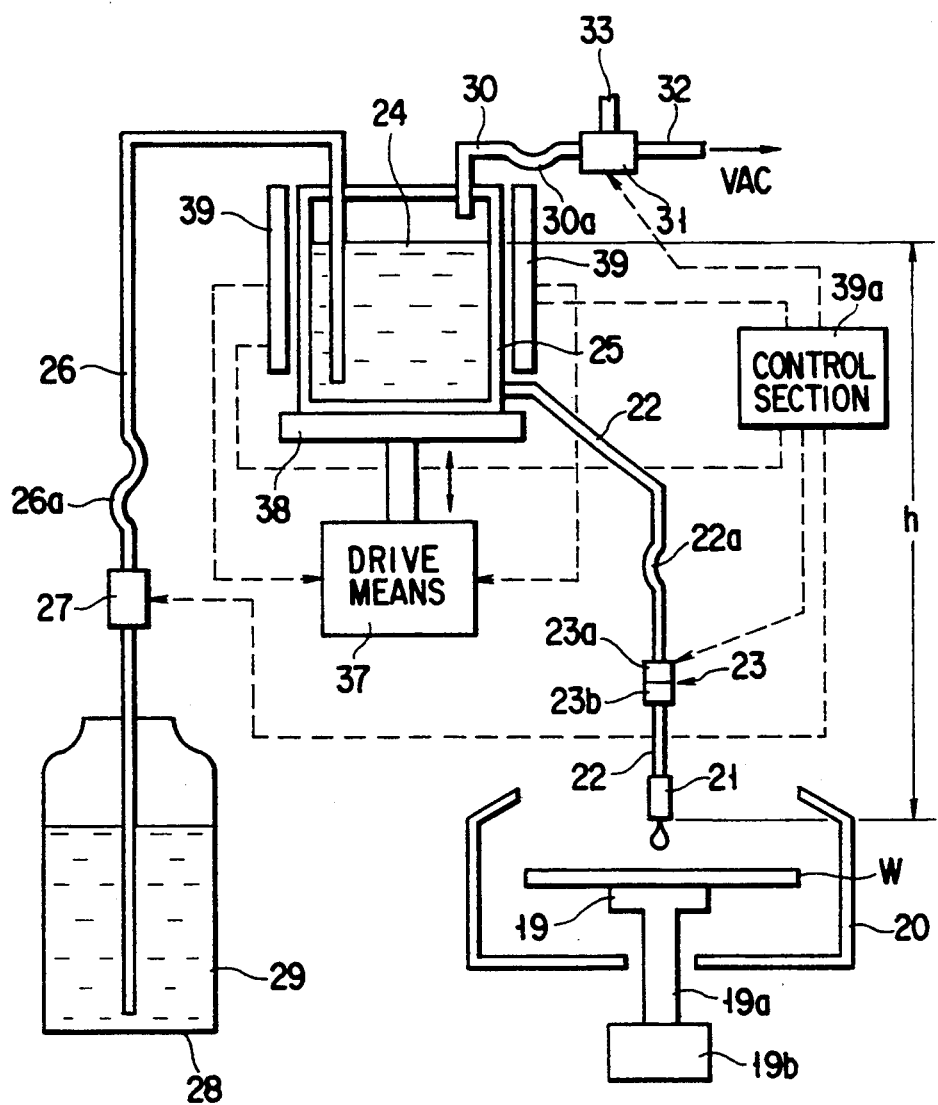
F I G. 7

SUBSTRATES PROCESSING DEVICE

BACKGROUND OF THE INVENTION

1. Field of the Invention

The present invention relates to a substrates processing device for supplying process solution such as resist and developer solutions to the surface of each of objects to be processed such as semiconductor wafers.

2. Description of the Related Art

According to the conventional devices for coating each of the semiconductor wafers with photo-resist solution, resist film is formed on each of the semiconductor wafers in such a way that the semiconductor wafer to be processed is sucked and held on a rotatable spin chuck, that resist solution which serves as process solution is dropped onto the rotating semiconductor wafer through a resist supply nozzle located above the spin chuck, that resist solution is spread all over the wafer by centrifugal force caused when the spin chuck is rotated at low speed, and that resist solution is shaken off from the wafer and dried while rotating the spin chuck at high speed.

The supply of resist solution to the resist supply nozzle is achieved through a resist supply pipe which includes a solution level detecting sensor, a pressure pump, a filter and a valve. In short, resist solution in a resist bottle is fed every certain amount to the nozzle by the pressure pump, while detecting the top level of resist solution in the bottle by the sensor. Particles caused in the pressure pump and others are removed from resist solution this time when resist solution passes through the filter. This prevents particles from being supplied to the semiconductor wafer. The valve is a combination of a switching valve and a suck-back valve and the suck-back valve serves to suck resist solution remaining in the nozzle not to be mistakenly dropped onto the surface of the semiconductor wafer through the nozzle when the switching valve is closed to stop the supply of resist solution to the nozzle.

This coating solution supply mechanism is a must for both of those coating devices which are of the solution-dropping and -spraying types.

In the case of the above-described coating solution supply mechanism used for the above-mentioned coating devices, however, solution is supplied to the resist supply nozzle by the pressure pump. This makes it unavoidable for particles and bubbles to enter into coating solution such as resist solution.

In addition, the pressure pump, the filter and the like must be attached to the supply pipe. This makes it necessary to provide fittings between the supply pipe and the pressure pump and between the supply pipe and others. Solution leakage is thus caused through those portions of the supply pipe to which these fittings are attached. This is quite troublesome. Further, it takes a lot of effort and a long time to attach the fittings to the supply pipe not to cause any solution leakage. Still further, resist solution is stayed in those stepped portions and clearances which are formed inside the fittings of the supply pipe in the case of the resist coating device, for example. Resist solution thus stayed is changed into gel as time goes by and these gel-like particles enter into resist solution.

On the other hand, there has been provided a coating device wherein coating solution is not fed by the pump but it is pressure-fed by inactive gas such as nitrogen gas. In the case of this coating device, however, the bottle in which coating solution such as resist solution is contained must be kept pressurized at all times. This is quite dangerous.

SUMMARY OF THE INVENTION

The object of the present invention is therefore to provide a substrates processing device capable of supplying a certain amount of process solution to a nozzle without using any pressure pump and pressurizing gas and without causing particles and bubbles to be mixed into process solution, and also capable of making simpler those pipe systems, through which process solution is supplied, so as to be more easily maintained.

This object of the present invention can be achieved by a substrates processing device including a tank in which process solution is contained; a bottle communicated with the tank through a pipe and located above an object to be processed with process solution supplied; a nozzle communicated with the bottle through a pipe and located under the bottle; means for supporting the object to be processed; and changeover means for making pressure in it negative through a pipe when process solution is to be added to it and also making pressure in it normal through the pipe when process solution is supplied to the nozzle.

According to the substrates processing device of the present invention, process solution such as resist solution contained in the tank is sucked into the bottle and stored in it when pressure in the bottle is made negative by switching the changeover means to a negative pressure source. Process solution is then naturally dropped due to its own weight onto the object such as the semiconductor wafer, which is to be processed with process solution, through the nozzle.

Process solution is sucked into the bottle by the action of negative pressure and none of the pressure pump and pressurizing gas is used in this case. Those particles which were caused in the conventional pressure pump and others can be therefore prevented from entering into process solution. In addition, bubbles in process solution can be removed when process solution is sucked into the bottle by the action of negative pressure. This means more stable the state of process solution supplied and process solution which has been made clear without using any filter can be supplied every certain amount to the nozzle.

Further, none of the pump and the filter is not needed. Those pipe systems through which process solution is introduced into the bottle and supplied to the nozzle can be thus made simpler and more easily maintained. In short, the number of fittings which cause process solution to be leaked can be reduced and maintenance for the pump, filter and others can be made unnecessary. Still further, pressurizing gas is not used. This can prevent pressurizing gas from being solved into process solution and also from damaging those components which are under pressure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4, 5 and 7 schematically show the resist coating devices according to other embodiments of the present invention.

DETAILED DESCRIPTION OF THE PREFERRED EMBODIMENTS

The substrates processing device according to an embodiment of the present invention will be described with reference to the accompanying drawings. The substrates processing device is embodied in this case as a device for coating semiconductor wafers with resist solution and description will be made on this resist coating device.

Figures 1, 2:
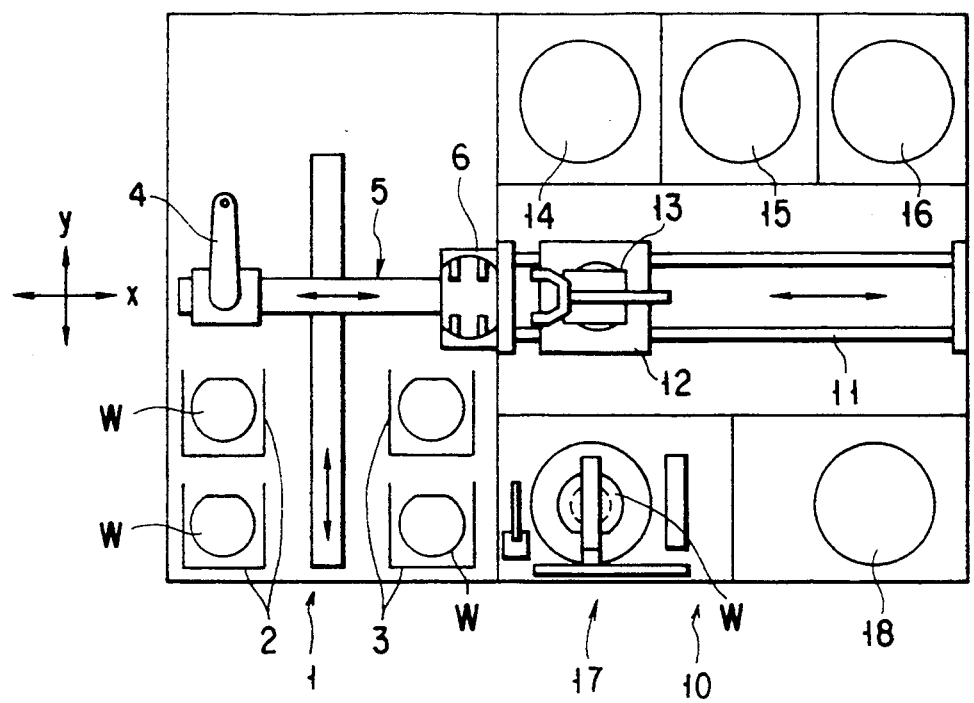
FIG. 1 is a plan schematically showing the resist coating and developing system in which the substrates processing device according to an embodiment of the present invention is incorporated.
FIG. 2 schematically shows a resist coating device which is embodied as the substrates processing device according to the present invention.

FIG. 1 shows the whole of the resist coating and developing system in which the resist coating device according to the present invention is incorporated. The resist coating and developing system comprises mainly a substrates processing unit 10 having means or units for applying various kinds of process to semiconductor wafers W which are object to be processed and which will be hereinafter referred to as wafers, and a unit 1 for automatically carrying the wafers W into and out of the substrates processing unit 10.

The wafers carrying-in and -out unit 1 comprises wafer carriers 2 for receiving wafers W which are not processed yet, wafer carriers 3 for receiving wafers W which have been processed, an arm 4 having means for sucking and holding each of the wafers W, a unit 5 for moving the arm 4 in directions X, Y and Z and swinging it in a direction $\theta$, and an alignment stage 6 for positioning each of the wafers w thereon and sending it to the substrates processing unit 10 and receiving it from the unit 10 after it is processed.

The substrates processing unit 10 includes a unit 12 freely movable on a carrying passage 11 which extends from the alignment stage 6 in the direction X. The carrying unit 12 includes a main arm 13 freely movable in the directions Y, Z and $\theta$. Arranged along and on one side of the carrying passage 11 are an adhesion process unit 14 for applying adhesion process to the wafers W to increase the adhering capacity of resist film relative to the wafers W, a pre-baking unit 15 for heat-evaporating solvents remaining in the resist film coated on the wafers W, and a unit 16 for cooling the wafers w which have been heat-processed. Also arranged along and on the other side of the carrying passage 11 are a developing unit 17 for coating process solution or developer on the surface of each of the wafers W and a resist coating device 18 (or substrates processing device) for coating the resist film on each of the wafers W.

According to the resist coating and developing system having the above-described arrangement, the wafer W which is not processed yet is carried out of the wafer carrier 2 and mounted on the alignment stage 6 by the arm 4 of the carrying-in and -out unit 1, and it is positioned on the stage 6. It is then held by the main arm 13 of the carrying unit 12 and carried to the process units 14–18 and other units, for example, stepper (not shown) successively. It is thus resist-coated and developed. When thus processed, it is returned to the alignment stage 6 by the main arm 13 and then carried to the wafer carrier 3 by the arm 4.

The resist coating device 18 will be described. FIG. 2 schematically shows the resist coating device 18 according to an embodiment of the present invention. Reference numeral 19 represents a spin chuck, which can be rotated at high speed while sucking and holding the wafer W, which is to be processed, by a vacuum chuck, for example. A Shaft 19a is connected to the spin chuck 19 at one end thereof and to a motor 19b at the other end thereof. When the motor 19b is driven, the spin chuck 19 is rotated while sucking and holding the wafer w. Sucking means (not shown) is connected to the spin chuck 19. A cup 20 encloses the spin chuck 19. The shaft 19a passes through the bottom of the cup 20. The cup 20 prevents resist solution, which is used as process solution, from scattering from the wafer W into the unit 10.

A resist supply pipe 22 is arranged above the spin chuck 19 and a process solution supply nozzle 21 is connected to the lower end of the resist supply pipe 22. The upper end of the resist supply pipe 22 is connected to the bottom of a solution container 25 (which will be hereinafter referred to as resist bottle). The resist bottle 25 is held in such a way that the top level of resist solution 24 in it has a predetermined height h of 500–1000 mm, for example, from the front end of the process solution supply nozzle 21. It is of the closed type.

An optical sensor 39 is arranged outside the resist bottle 25 to detect the top level of resist solution 24 in the bottle 25. The optical sensor 39 is connected to a control section 39a, which opens or closes valves 23, 27 and a cross valve 31 responsive to information applied from the optical sensor 39 relating to upper and lower limits of the top level of resist solution 24. Only the valve 23 which comprises a combination of a switching valve 23a and a suck-back valve 23b is attached to the resist solution supply pipe 22 to enable resist solution 24 in the resist bottle 25 to be dropped under controlled state through the nozzle 21.

One end of a resist solution introducing pipe 26 is attached to the resist bottle 25, passing through the top of the bottle 25 into it. The other end of the pipe 26 extends into a resist tank 28 different from the resist bottle 25. The switching valve 27 is attached halfway the resist solution introducing pipe 26. A suction and ventilation pipe 30 is attached to the top of the resist bottle 25. The cross valve 31 which serves as suction and ventilation switching means is attached to the suction and ventilation pipe 30 to connect the pipe 30 either to a suction pipe 32 communicated with a vacuum means or negative pressure source VAC (not shown) or to a ventilation pipe 33.

Figure 3:
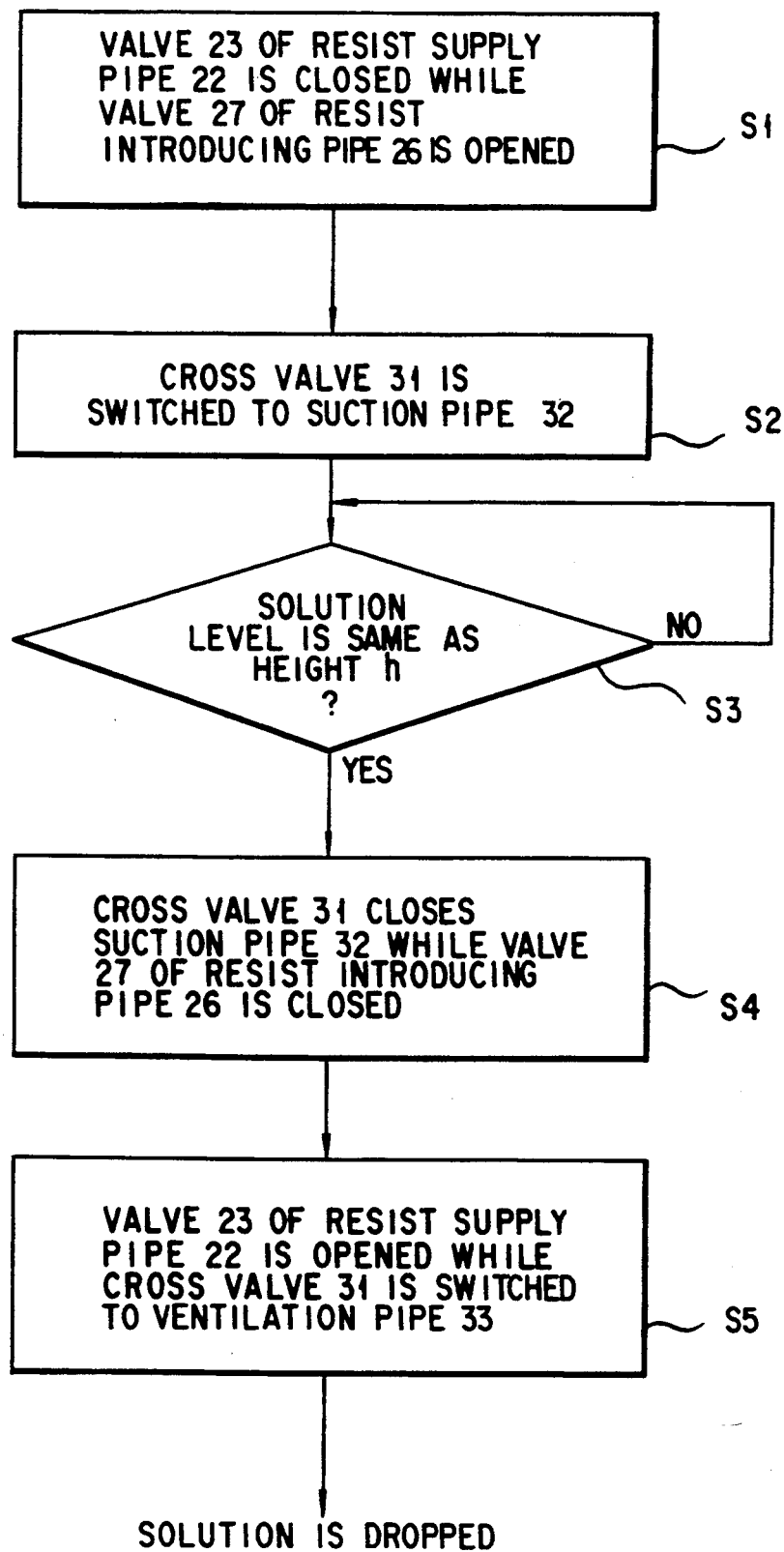
FIGS. 3 and 6 are flow charts showing how the resist coating device is operated.

When resist solution is to be added into the resist bottle 25 in the above-described resist coating device 18, the valve 23 of the resist supply pipe 22 is automatically closed while the valve 27 of the resist introducing pipe 26 is opened by the control section 39a at a step $S_1$, as shown in FIG. 3. The cross valve 31 is switched to the suction pipe 32 communicated with the negative pressure source VAC at step $S_2$, and pressure in the resist bottle 25 is thus made negative by the negative pressure source VAC so that resist solution 29 in the resist tank 28 can be sucked and fed into the resist bottle 25. While detecting the top level of resist solution 24 in the resist bottle 25 by the optical sensor 39, resist solution 24 is stored in the resist bottle 25 at a step $S_3$ until its top level reaches the height h. When the top level of resist solution 24 in the bottle 25 comes to the height h, the valve 27 of the resist introducing pipe 26 is closed while the cross valve 31 is closed not to communicate with the suction pipe 32 at a step $S_4$. The valve 23 is then opened and the cross valve 31 is switched to the ventilation pipe 33 at a step $S_5$. The inside of the resist bottle 25 is thus communicated with atmospheric air so that the top of resist solution 24 in the bottle 25 can be pushed down to cause resist solution 24 to be dropped from the bottle 25 through the nozzle 21. The reason why the cross valve 31 is switched to the ventilation pipe 33 is to cause resist solution 24 to be naturally dropped by the action of atmospheric pressure. In order to prevent resist solution 24 from being oxidized, therefore, inactive gas such as nitrogen gas may be supplied under same pressure as atmosphere into the resist bottle 25 through the ventilation pipe 33 instead of communicating the ventilation pipe 33 with atmosphere.

In the case of the above-described resist coating device 18, the wafer W is loaded on the spin chuck 19 by the main arm 13. The switching valve 23a is then opened for a certain time period and resist solution 24 in the resist bottle 25 is thus naturally dropped onto the wafer W on the rotating spin chuck 19 by a certain amount. The resist solution thus dropped on the wafer W is spread all over the wafer W by the spin chuck 19 which is being rotated at low speed, and then shaken off from the wafer w and dried by the spin chuck 19 which is rotated at high speed. Thereby, a resist film is formed on the surface of the wafer. The switching valve 23a is closed while the suck-back valve 23b is made operative, so that resist solution 24 remaining in the nozzle 21 can be sucked back not to drop under uncontrolled state onto the wafer W. The amount of resist solution 24 supplied is adjusted by adjusting the time during which the switching valve 23a is opened. The wafer W whose coating has been finished in this manner is unloaded from the spin chuck 19 by the main arm 13.

According to the resist coating device shown in FIG. 2, resist solution 24 can be dropped onto the wafer W by a certain amount without using any pump and pressurizing gas. Particles which were conventionally caused by the pressure pump used can be thus prevented from entering into resist solution 24. In addition, bubbles in resist solution can be removed by the negative pressure suction to thereby make stable the state of the resist solution dropped. Further, such members as the pump and the filter can be made unnecessary. This makes simpler those pipe systems through which the resist solution is supplied to the nozzle and introduced into the resist bottle, and the maintenance of the device can be made easier. In short, the number of those parts which cause the resist solution to be leaked can be reduced and maintenance for the pump and the filter can be made unnecessary. Still further, the space for the device can be more efficiently used because the resist bottle 25 is located above the process solution supply nozzle 21.

In the case of the resist coating device shown in FIG. 2, the height h which extends from the front end of the nozzle 21 to the top level of resist solution 24 in the resist bottle 25 is previously set certain and resist solution 24 is then dropped through the nozzle 21 without introducing resist solution 29 into the resist bottle 25. However, it may be arranged that resist solution 24 is dropped through the nozzle 21 while keeping the height h certain at all times. When arranged in this manner, the amount of the resist solution dropped can be made certain and the speed and the strength at and with which the resist solution is dropped onto the surface of each wafer w can be made certain.

The height h can be kept certain at all times by two ways. One of them is to use a resist solution adding means through which resist solution 24 can be continually added into the resist bottle 25 by such as amount of resist solution 24 that is being consumed. The other is to move the resist bottle 25 so as to keep the height h certain.

Figure 4:
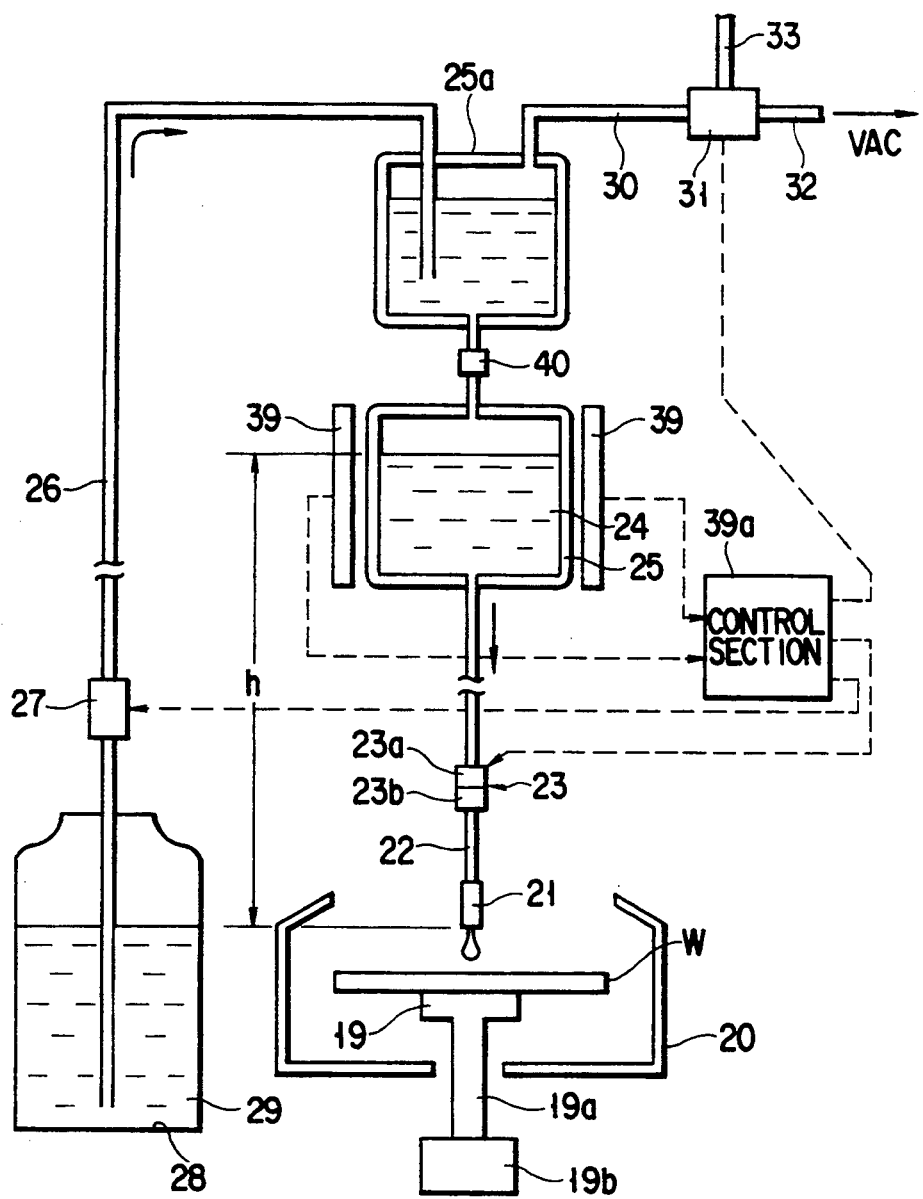

The first way can be achieved when at least one resist solution adding means 25a is located above the resist bottle 25 and connected in series and tandem to the bottle 25, as shown in FIG. 4. The resist solution introducing pipe 26 and the suction and ventilation pipe 30 shown in FIG. 2 are attached to the resist solution adding means 25a and a switching valve 40 is arranged between the resist solution adding means 25a and the resist bottle 25 in this case. The switching valve 40 is connected to the control section 39a and it is opened to add the resist solution into the resist bottle 25 when the top level of resist solution 24 in the bottle 25 does not reach the height h.

Figure 5:
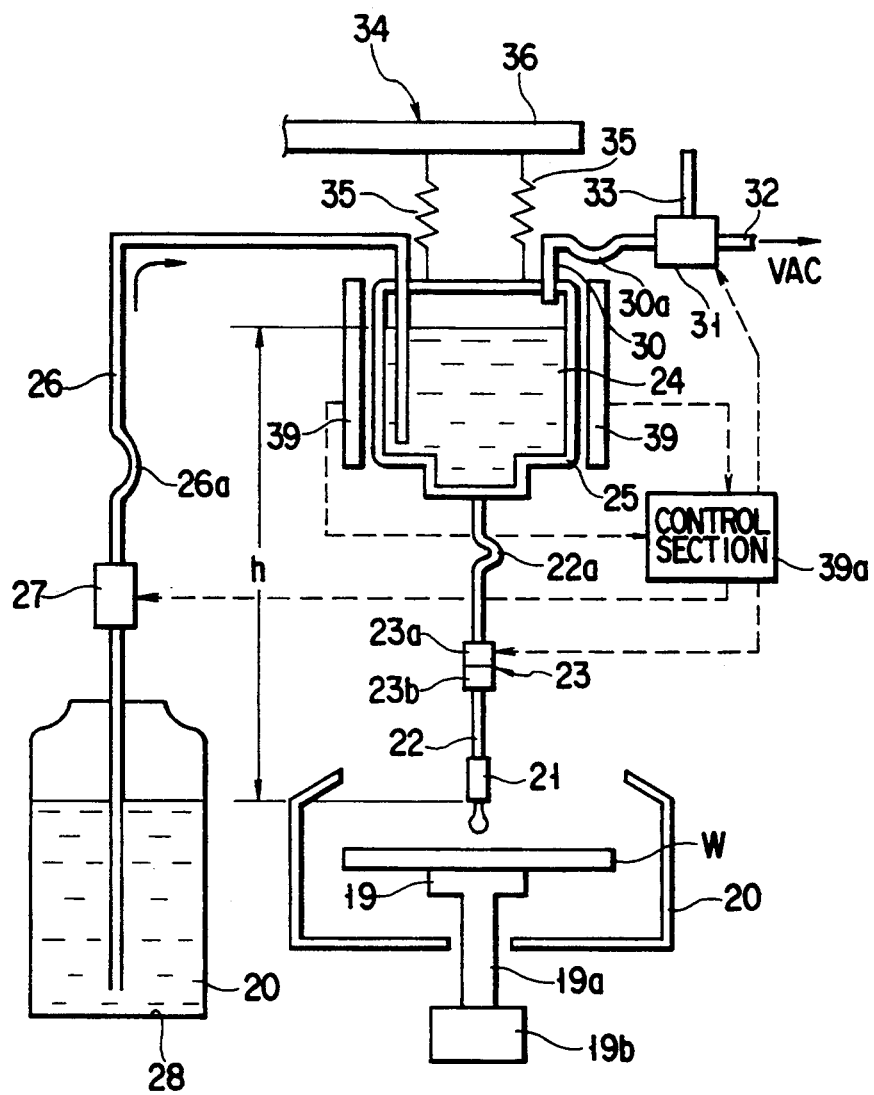

The second way can be achieved when a bottle lifter means is used as shown in FIGS. 5 and 7.

In the case of the bottle lifter means shown in FIG. 5, a part of each of the resist solution supplying and introducing pipes 22, 26 and the suction and ventilation pipe 30 is made of flexible material such as resin. In addition, the resist bottle 25 is held by a bottle holder means 34. The bottle holder means 34 comprises a support member 36 and a coil spring 35 arranged between the support member 36 and the resist bottle 25 to adjust the weight of the resist bottle 25. The height h can be kept certain at all times by properly selecting the spring constant of the coil spring 35. When the amount of resist solution 24 in the bottle 25 is made smaller and the weight of the whole resist bottle 25 becomes lighter, the coil spring 35 constructs to pull up the resist bottle 25 so as to keep the height h certain. The resist solution supplying and introducing pipes 22, 26 and the suction and ventilation pipe 30 are deformed this time at their flexible parts 22a, 26a and 30a to allow the resist bottle 25 to be moved up and down.

The resist solution is added into the resist bottle 25 as follows in the case of the resist coating device shown in FIG. 5. When it is detected by the optical sensor 39 that the top level of the resist solution in the bottle 25 becomes same as the low limit, the valve 23 of the resist supply pipe 22 is automatically closed while the valve 27 of the resist introducing pipe 26 is opened by the control section 39a at a step $S_{11}$. The cross valve 31 is switched to the suction pipe 32 communicated with the negative pressure source VAC at a step $S_{12}$. Pressure in the resist bottle 25 is thus made negative by the negative pressure source VAC, thereby allowing resist solution 29 in the resist tank 28 to be sucked and fed into the resist bottle 25. Resist solution 24 is stored in the resist bottle 25 at a step $S_{13}$ until its top level becomes same as the height h, while detecting its top level by the optical sensor 39. When its top level reaches the height h, the valve 27 of the resist introducing pipe 26 is closed and the cross valve 31 closes the suction pipe 32 at a step $S_{14}$. The valve 23 is then opened while the cross valve 31 is switched to the ventilation pipe 33 at a step $S_{15}$. Resist solution 24 in the bottle 25 is thus again dropped through the nozzle 21.

Even if the amount of resist solution 24 in the bottle 25 is made smaller as the dropping of resist solution 24 progresses, the resist bottle 25 is pulled up by the coil spring 35 and resist solution 24 is added into the bottle 25. The height h can be thus kept certain at all times. This enables resist solution 24 to be continuously and stably dropped through the nozzle 21.

The amount of resist solution 24 dropped was checked in the resist coating device shown in FIG. 5. When every drop of resist solution 24 had a volume of 2.0 cc, it was confirmed that the drops thus checked had an error of about ±6. This error is same as seen in the conventional resist coating device which used the pump.

In the case of the bottle lifter means shown in FIG. 7, at least a part of each of the resist solution supplying and introducing pipes 22, 26 and the suction and ventilation pipe 30 is made flexible and the resist bottle 25 is mounted on a table 38 which is made movable up and down by a drive means 37 such as the motor and the air cylinder. The height h can be kept certain at all times by the drive means 37. In short, the top level of resist solution 24 in the resist bottle 25 is detected by the optical sensor 39 and the drive means 37 is driven responsive to information applied from the sensor 39 to gradually lift the table 38. The top level of resist solution 24 in the bottle 25 can be thus kept certain or same as the height h.

Figure 6:
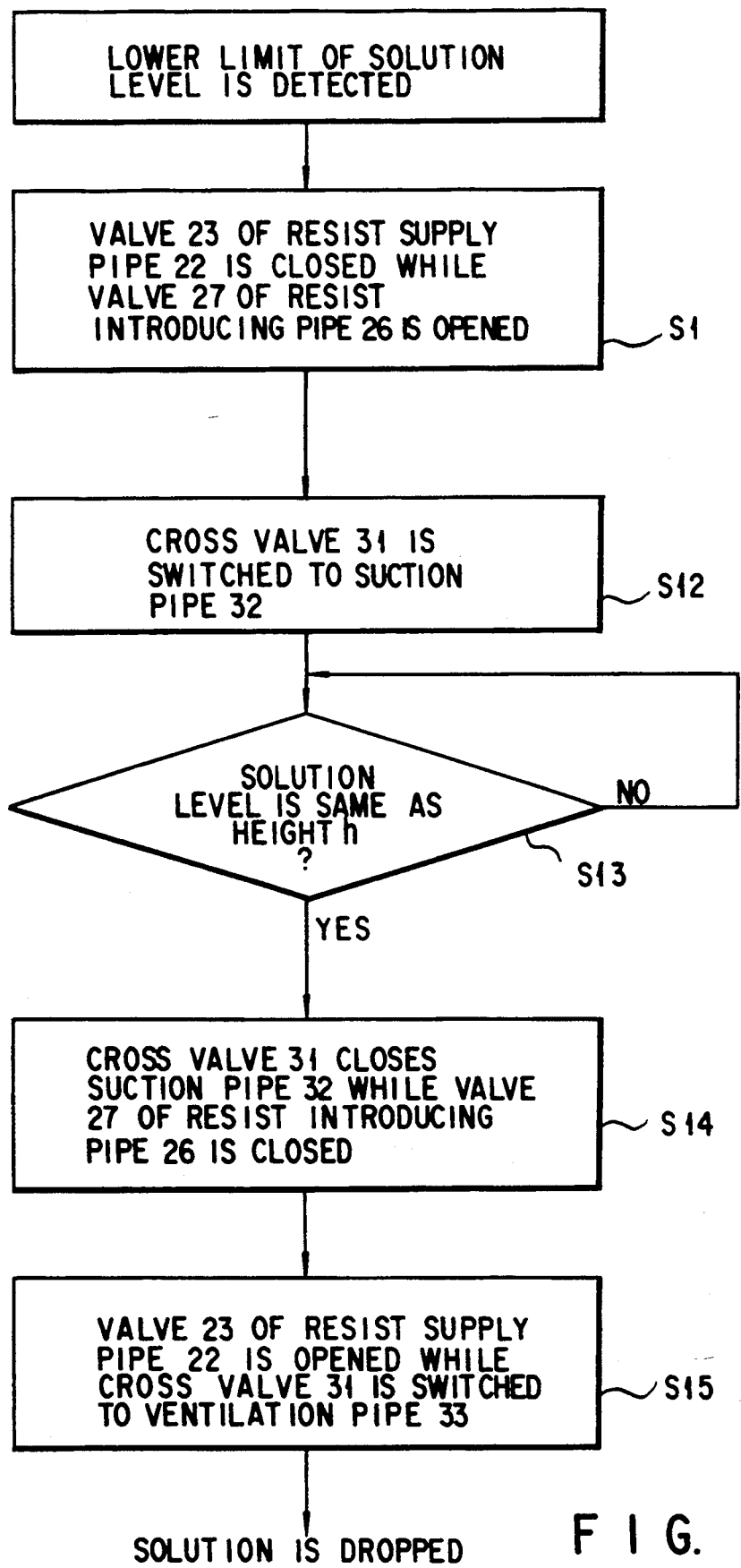

The resist solution can be added, same as seen in FIG. 6, into the resist bottle 25 in the resist coating device shown in FIG. 7. Even if the amount of resist solution 24 in the bottle 25 is made smaller as the dropping of resist solution 24 progresses, therefore, the information relating to the top level of resist solution 24 in the bottle 25 is fed back to lift the resist bottle 25 and to add resist solution 24 into the bottle 25. The height h can be thus kept certain at all times. This enables resist solution 24 to be continuously and stably dropped through the nozzle 21.

The coat of the resist coating device shown in FIG. 7 becomes high, but even when resist solutions whose specific gravities are different are used, their top levels can be more accurately controlled. The resist supply pipe 22 has been attached to the side of the resist bottle 25 in FIG. 7, but it may be attached to the top of the resist bottle 25 to pick up resist solution 24 through the top of the bottle 25.

Although the objects to be processed have been semiconductor wafers in the above-described cases, they may be LCD, glass and printed circuit boards. Although the present invention have been embodied as the resist coating device in the above-described cases, it can be applied to the developer, etching and magnetic material solutions coating devices and to the cleaning device as well.

Needless to say, it is preferable that the height h from the front end of the nozzle to the top level of the resist solution in the bottle is set as accurate as the level of technique could allow.

According to the substrates processing device as described above, the process solution is sucked by the action of negative pressure and none of the pressure pump and pressurizing gas is used in this case. This prevents particles, which were caused by the pressure pump and others, from entering into the process solution. In addition, bubbles in the solution can be removed by the suction of negative pressure. The state of the process solution dropped can be thus made more stable and the process solution can be supplied every certain amount into the resist bottle without using any filter. Such members as the pump and the filter are thus made unnecessary. This makes simpler the pipe systems through which the process solution is supplied and introduced into the nozzle and the resist bottle, and also makes their maintenance easier.

When the distance or height h extending from the front end of the nozzle to the top level of the process solution in the bottle is controlled certain, the process solution can be continuously and stably dropped through the nozzle.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A substrate processing device comprising:
   a tank for containing process solution;
   a bottle communicating with the tank through a first conduit and located above an object to be processed with the process solution supplied;
   a nozzle communicating with said bottle through a second conduit and located under said bottle;
   means for supporting the object to be processed and located below said nozzle;
   a changeover means for making pressure in said bottle negative through a third conduit, thereby to introduce the process solution into said bottle, and also making the pressure normal through the third conduit, thereby to supply the process solution to the nozzle, and connected to said bottle; and
   means for maintaining a distance between a top level of the process solution in said bottle and a front end of the nozzle constant.

2. The substrate processing device according to claim 1, further comprising a first valve, which is attached to said first conduit, for adjusting an amount of said process solution introduced from said tank into said bottle, and a second valve, which is attached to said second conduit, for starting and stopping the supply of said process solution to the nozzle.

3. The substrate processing device according to claim 2, wherein said second valve includes a suck-back valve for preventing said process solution from being excessively supplied to the object to be processed.

4. The substrate processing device according to claim 1, wherein said support means includes means for sucking and holding the object to be processed.

5. The substrate processing device according to claim 1, wherein said support means includes means for rotating the object to be processed.

6. The substrate processing device according to claim 1, wherein said means for maintaining includes an optical sensor arranged outside the bottle, for detecting a top level of said process solution in said bottle.

7. The substrate processing device according to claim 6, wherein said means for maintaining includes control means for controlling said changeover means in response to information applied from said optical sensor and representing the top level of said process solution detected.

8. The substrate processing device according to claim 7, further comprising a first valve, which is attached to said first conduit, for adjusting an amount of said process solution introduced from said tank into said bottle, and a second valve, which is attached to said second conduit, for starting and stopping the supply of said process solution to said nozzle, wherein said first and second valves are connected to said control means.

9. A substrate processing device comprising:
a tank for containing process solution;
process solution adding means communicating with said tank through a first conduit and located above an object to be processed with said process solution supplied;
a bottle communicating with said solution adding means through a fourth conduit and located under said solution adding means;
a nozzle communicating with said bottle through a second conduit and located under said bottle;
an optical sensor located outside the bottle, for detecting the top level of said process solution in said bottle;
control means connected to said optical sensor, for controlling changeover means in response to information applied from said optical sensor and representing the top level of said process solution detected;
means for supporting the object to be processed and located below said nozzle; and
a changeover means for making pressure in said bottle negative through a third conduit, thereby to introduce said process solution into said bottle, and also for making pressure in said bottle normal through the third conduit, thereby to supply said process solution to the nozzle, and connected to said bottle,
wherein a distance between a top level of the process solution in said bottle and a front end of the nozzle is kept constant.

10. The substrate processing device according to claim 9, further comprising a third valve, which is attached to said fourth conduit, for adjusting an amount of said process solution supplied from said process solution adding means to said bottle.

11. The substrate processing device according to claim 10, wherein said third valve is connected to said control means.

12. A substrate processing device comprising:
a tank for containing process solution;
a bottle communicating with said tank through a first conduit and located above an object to be processed with said process solution supplied;
a nozzle communicating with said bottle through a second conduit and located under said bottle;
an optical sensor located outside said bottle, for detecting the top level of said process solution in said bottle;
control means connected to said optical sensor, for controlling changeover means in response to information applied from said optical sensor and representing the top level of said process solution detected;
bottle lifter means for moving said bottle up and down in response to the information representing the top level of said process solution, and connected to said bottle;
means for supporting said object to be processed and located below said nozzle; and
a changeover means for making pressure in said bottle negative through a third conduit, thereby to introduce the process solution into said bottle, and also for making the pressure normal through the third conduit, thereby to supply said process solution to the nozzle, and connected to said bottle.

13. The substrate processing device according to claim 12, wherein each of said first, second and third conduits has a flexible part.

14. The substrate processing device according to claim 12, wherein said first, second and third conduits are made of resin.

15. The substrate processing device according to claim 12, wherein said bottle lifter means includes support member and a coil spring which connect said support member and said bottle.

16. The substrate processing device according to claim 12, wherein said bottle lifter means includes a bottle-mounted table and drive means for driving said bottle-mounted table up and down.

17. The substrate processing device according to claim 16, wherein said drive means is connected to said control means.

* * * * *